(12) United States Patent
Wu et al.

(10) Patent No.: US 8,776,514 B2
(45) Date of Patent: Jul. 15, 2014

(54) ELECTROTHERMAL MICROACTUATOR FOR LARGE VERTICAL DISPLACEMENT WITHOUT TILT OR LATERAL SHIFT

(76) Inventors: Lei Wu, Gainesville, FL (US); Huikai Xie, Gainesville, FL (US)

( * ) Notice: Subject to any disclaimer, the term of this patent is extended or adjusted under 35 U.S.C. 154(b) by 969 days.

(21) Appl. No.: 12/743,499

(22) PCT Filed: Dec. 15, 2008

(86) PCT No.: PCT/US2008/086844
§ 371 (c)(1),
(2), (4) Date: Aug. 19, 2010

(87) PCT Pub. No.: WO2009/079460
PCT Pub. Date: Jun. 25, 2009

(65) Prior Publication Data
US 2010/0307150 A1    Dec. 9, 2010

Related U.S. Application Data

(60) Provisional application No. 61/007,762, filed on Dec. 14, 2007.

(51) Int. Cl.
*F01B 29/10*    (2006.01)
*G02B 26/00*    (2006.01)

(52) U.S. Cl.
USPC ............... 60/528; 60/529; 310/307; 359/290; 359/254

(58) Field of Classification Search
USPC ............. 60/527–529; 310/306–307; 359/237, 359/245, 254, 290, 291, 298
See application file for complete search history.

(56) References Cited

U.S. PATENT DOCUMENTS 5,491,604 A  *  2/1996  Nguyen et al. ................ 361/278

(Continued)

FOREIGN PATENT DOCUMENTS

CN    1564451    1/2005

(Continued)

OTHER PUBLICATIONS

Carr, E.J., et al., "Large-Stroke Self-Aligned Vertical Comb Drive Actuators for Adaptive Optics Applications," submitted Nov. 30, 2005; published in *Proceedings of SPIE*, Article No. 61130T, vol. 6113, Jan. 23, 2006; presented at Photonics West 2006 (an SPIE Event), San Jose, CA, on Jan. 25, 2006.

(Continued)

*Primary Examiner* — Hoang Nguyen
(74) *Attorney, Agent, or Firm* — Saliwanchik, Lloyd & Eisenschenk

(57) ABSTRACT

A microactuator for displacing a platform vertically with respect to a substrate includes a first rigid frame, a first flexible bimorph beam connecting the first frame to the substrate, a second rigid frame, a second flexible bimorph beam connecting the second frame to the first frame, and a third flexible bimorph beam connecting a platform to the second frame. Activation of the first, second, and third flexible bimorph beams allows vertical displacement of the platform with respect to the substrate, with negligible lateral shift. A microactuator assembly includes a substrate, a plurality of first rigid frames, a plurality of first flexible bimorph beams, a plurality of second rigid frames, a plurality of second flexible bimorph beams, a platform, and a plurality of third flexible bimorph beams. Activation of the first, second, and third bimorph beams allows vertical displacement of the platform with respect to the substrate, with negligible lateral shift. A further embodiment with four identical such microactuators oriented at four sides of the platform, can achieve 1D or 2D angular scanning of the mirror plate by the activation of 1 or 2 adjacent microactuators.

36 Claims, 22 Drawing Sheets

(56) References Cited

U.S. PATENT DOCUMENTS

| | | | |
|---|---|---|---|
| 5,649,454 A * | 7/1997 | Midha et al. | 74/520 |
| 6,175,170 B1 * | 1/2001 | Kota et al. | 310/40 MM |
| 6,211,598 B1 | 4/2001 | Dhuler et al. | |
| 6,275,320 B1 * | 8/2001 | Dhuler et al. | 359/237 |
| 6,360,539 B1 * | 3/2002 | Hill et al. | 60/528 |
| 6,410,361 B2 | 6/2002 | Dhuler et al. | |
| 6,428,173 B1 | 8/2002 | Dhuler et al. | |
| 6,563,106 B1 | 5/2003 | Bowers et al. | |
| 6,594,994 B2 | 7/2003 | Gianchandani et al. | |
| 6,628,041 B2 | 9/2003 | Lee et al. | |
| RE38,307 E | 11/2003 | Gustafsson et al. | |
| 6,681,063 B1 | 1/2004 | Kane et al. | |
| 6,691,513 B1 | 2/2004 | Kolesar | |
| 6,712,983 B2 | 3/2004 | Zhao et al. | |
| 6,735,008 B2 | 5/2004 | Brophy et al. | |
| 6,753,638 B2 | 6/2004 | Adams et al. | |
| 6,804,036 B1 | 10/2004 | Chen et al. | |
| 6,860,107 B2 | 3/2005 | Silverbrook | |
| 6,934,439 B2 | 8/2005 | Mala et al. | |
| 6,940,630 B2 * | 9/2005 | Xie | 359/290 |
| 6,964,898 B1 | 11/2005 | Cheng | |
| 6,967,757 B1 | 11/2005 | Allen et al. | |
| 6,998,278 B2 | 2/2006 | Silverbrook | |
| 7,072,045 B2 | 7/2006 | Chen et al. | |
| 7,098,571 B2 | 8/2006 | Adams et al. | |
| 7,116,115 B2 | 10/2006 | Gianchandani et al. | |
| 7,187,035 B2 | 3/2007 | Nagano et al. | |
| 7,187,485 B2 | 3/2007 | Bernstein et al. | |
| 7,205,226 B1 | 4/2007 | Schaefer et al. | |
| 7,208,391 B2 | 4/2007 | Sato et al. | |
| 7,214,625 B2 | 5/2007 | Asami et al. | |
| 7,215,429 B2 | 5/2007 | Xie | |
| 7,226,825 B2 | 6/2007 | Anderson et al. | |
| 7,227,432 B2 | 6/2007 | Lutz et al. | |
| 7,267,447 B2 | 9/2007 | Kim et al. | |
| 7,456,698 B2 * | 11/2008 | Gianchandani et al. | 331/154 |
| 2002/0164111 A1 | 11/2002 | Mirza | |
| 2002/0167072 A1 | 11/2002 | Andosca | |
| 2003/0024243 A1 | 2/2003 | Gianchandani et al. | |
| 2003/0117257 A1 | 6/2003 | Cunningham | |
| 2003/0142934 A1 | 7/2003 | Pan et al. | |
| 2004/0012298 A1 | 1/2004 | Cunningham et al. | |
| 2004/0055294 A1 | 3/2004 | Silverbrook | |
| 2005/0017172 A1 | 1/2005 | Gianchandani et al. | |
| 2005/0162765 A1 | 7/2005 | Hagelin et al. | |
| 2006/0008201 A1 | 1/2006 | Miller et al. | |
| 2006/0066964 A1 | 3/2006 | Greywall | |
| 2006/0077525 A1 | 4/2006 | Huibers | |
| 2007/0038119 A1 | 2/2007 | Chen et al. | |
| 2007/0103029 A1 | 5/2007 | Fedder et al. | |
| 2007/0103843 A1 | 5/2007 | Charton et al. | |

FOREIGN PATENT DOCUMENTS

| | | |
|---|---|---|
| KR | 2004-0065491 | 7/2004 |
| WO | WO-02-080255 A1 | 10/2002 |
| WO | WO-2004-066363 A2 | 8/2004 |
| WO | WO-2006-004770 A2 | 1/2006 |
| WO | WO-2007-041376 A1 | 4/2007 |

OTHER PUBLICATIONS

Jain, A., et al., "Half-Millimeter-Range Vertically Scanning Microlenses for Microscopic Focusing Applications," 2006 Solid-State Sensors, Actuators, and Microsystems Workshop, Jun. 2006, Hilton Head Island, SC, pp. 74-77.

Jeung, W.-K., et al., "Large Displacement Out-of-Plane Bimorph Actuator for Optical Application," *Key Engineering Materials*, 2006, pp. 1383-1386, vol. 326-328.

Chiou, J.C., et al., "A Novel Large Displacement Electrostatic Actuator: Pre-Stress Comb-Drive Actuator," *Journal of Micromechanics and Microengineering*, 2005, pp. 1641-1648, vol. 15, No. 9.

Gilgunn, P.J., et al., "Flip-Chip Integrated SOI-CMOS-MEMS Fabrication Technology," Solid-State Sensors, Actuators, and Microsystems Workshop, Jun. 1-5, 2008, Hilton Head Island, SC, pp. 10-13.

Greywall, D.S., et al., "High-Fill-Factor Adaptive Optics Mirrors with Independent Piston, Tip and Tilt Controls," *Journal of Micromechanics and Microengineering*, 2006, pp. N1-N7, vol. 16, No. 3.

Hah, D., et al., "A Self-Aligned Vertical Comb-Drive Actuator on an SOI Wafer for a 2D Scanning Micromirror," *Journal of Micromechanics and Microengineering*, 2004, pp. 1148-1156, vol. 14, No. 8.

Jain, A., et al., "An Electrothermal Microlens Scanner with Low-Voltage Large-Vertical-Displacement Actuation," *IEEE Photonics Technology Letters*, Sep. 2005, pp. 1971-1973, vol. 17, No. 9.

Jain, A., et al., "A Single-Crystal Silicon Micromirror for Large Bi-Directional 2-D Scanning Applications," *Sensors and Actuators A: Physical*, 2006, pp. 454-460, vols. 130-131.

Jain, A., et al., "A Thermal Bimorph Micromirror with Large Bi-Directional and Vertical Actuation," *Sensors & Actuators A*, 2005, pp. 9-15, vol. 122, No. 1.

Jia, K., et al., "An Agile Tip-Tilt-Piston Micromirror with Large Aperture, Large Scanning Range and Low Driving Voltage," Solid-State Sensors, Actuators, and Microsystems Workshop, Jun. 1-5, 2008, Hilton Head Island, SC, pp. 284-287.

Jia, K., et al., "High-Fill-Factor, Tip-Tilt-Piston Micromirror Arrays with Hidden Bimorph Actuators and Flip-Chip Packaging," IEEE/LEOS International Conference on Optical MEMS and Nanophotonics, Aug. 17-20, 2009, Clearwater, FL, pp. 67-68.

Jung, I.W., et al., "High Fill-Factor Two-Axis Gimbaled Tip-Tilt-Piston Micromirror Array Actuated by Self-Aligned Vertical Electrostatic Combdrives," *Journal of Microelectromechanical Systems*, 2006, pp. 563-571, vol. 15, No. 3.

Kim, J., et al., "Micro Vertical Comb Actuators by Selective Stiction Process," *Sensors & Actuators A: Physical*, 2006, pp. 248-254, vol. 127.

Lee, C., et al., "Development of Electrothermal Actuation Based Planar Variable Optical Attenuators (VOAs)," *Journal of Physics: Conference Series*, 2006, pp. 1026-1031, vol. 34.

Li, G., et al., "Three-Dimensional Optoelectronic Stacked Processor by Use of Free-Space Optical Interconnection and Three-Dimensional VLSI Chip Stacks," *Applied Optics*, 2002, pp. 348-260, vol. 41, No. 2.

Lin, H.Y., et al., "Rib-Reinforced Micromachined Beam and Its Applications," *Journal of Micromechanics and Microengineering*, 2000, pp. 93-99, vol. 10, No. 1.

McManamon, P.F., "Agile Nonmechanical Beam Steering," *Optics & Photonics News (OPN)*, Mar. 2006, pp. 25-29, vol. 17, No. 3.

Mcmanamon, P.F., et al., "Optical Phased Array Technology," *Proceedings of the IEEE*, Feb. 1996, pp. 268-298, vol. 84, No. 2.

Milanovic, V., et al., "Fully-Functional Tip-Tilt-Piston Micromirror Array," IEEE/LEOS International Conference on Optical MEMS and Their Applications, 2006, pp. 38-39.

Pardo, F., et al., "Flexible Fabrication of Large Pixel Count Piston-Tip-Tilt Mirror Arrays for Fast Spatial Light Modulators," *Microelectronic Engineering*, 2007, pp. 1157-1161, vol. 84, Nos. 5-8.

Sarajlic, E., et al., "Versatile Trench Isolation Technology for the Fabrication of Microactuators," *Microelectronic Engineering*, 2003, pp. 430-437, vol. 67-68.

Seibel, E.J., et al., "Microfabricated Optical Fiber with Microlens That Produces Large Field-of-View, Video Rate, Optical Beam Scanning for Microendoscopy Applications," *Proceedings of SPIE*, 2003, pp. 46-55, vol. 4957.

Shin, J.-W., et al., "Design and Fabrication of Micromirror Array Supported by Vertical Springs," *Sensors and Actuators A: Physical*, 1998, pp. 144-149, vol. 66, Nos. 1-3.

Taylor, W.P., et al., "A High Fill Factor Linear Mirror Array for a Wavelength Selective Switch," *Journal of Micromechanics and Microengineering*, 2004, pp. 147-152, vol. 14, No. 1.

Todd, S.T., et al., "A Multi-Degree-of-Freedom Micromirror Utilizing Inverted-Series-Connected Bimorph Actuators," *Journal of Optics A Pure and Applied Optics*, 2006, pp. 352-359, vol. 8.

(56) References Cited

OTHER PUBLICATIONS

Tuantranont, A., et al., "Simulation of Curl Compensation in MEMS Micromirror," *Journal of Physics: Conference Series*, 2006, pp. 168-173, vol. 34.

Wu, L., et al., "A Large Rotation Angle Electrothermal Micromirror with Integrated Platinum Heater," IEEE/LOS International Conference on Optical MEMS and Their Applications, Aug. 21-24, 2006, pp. 106-107.

Wu, L., et al., "A Large Vertical Displacement Electrothermal Bimorph Microactuator with Very Small Lateral Shift," *Sensors & Actuators A: Physical*, Jul. 2008, pp. 371-379, vol. 145.

Wu, L., et al., "A Lateral-Shift-Free and Large-Vertical-Displacement Electrothermal Actuator for Scanning Micromirror/Lens," International Solid-State Sensors, Actuators and Microsystems Conference, Jun. 10-14, 2007, pp. 1075-1078.

Wu, M., et al., "A Molded Surface-Micromachining and Bulk Etching Release (MOSBE) Fabrication Platform on (1 1 1) Si for MOEMS," *Journal of Micromechanics and Microengineering*, 2006, pp. 260-265, vol. 16, No. 2.

Wu, M., et aL, "Design and Fabrication of MEMS Devices Using the Integration of MUMPs, Trench-Refilled Molding, DRIE and Bulk Silicon Etching Processes," *Journal of Micromechanics and Microengineering*, 2005, pp. 535-542, vol. 15, No. 3.

Xie, H., "Large-Range Large-Aperture MEMS Micromirrors for Biomedical Imaging Applications," IEEE, 9th International Conference on Solid-State and Integrated-Circuit Technology, Oct. 20-23, 2008, Beijing, China, pp. 2549-2552.

Yang, H., et al., "High Fill-Factor Microlens Array Mold Insert Fabrication Using a Thermal Reflow Process," *Journal of Micromechanics and Microengineering*, 2004, pp. 1197-1204, vol. 14, No. 8.

\* cited by examiner

Meshed SiO₂ lens holder

ELECTROTHERMAL MICROACTUATOR FOR LARGE VERTICAL DISPLACEMENT WITHOUT TILT OR LATERAL SHIFT

CROSS-REFERENCE TO RELATED APPLICATIONS

This application is the U.S. national stage application of International Patent Application No. PCT/US2008/086844, filed Dec. 15, 2008, which claims the benefit of U.S. Provisional Application Ser. No. 61/007,762, filed Dec. 14, 2007, the disclosures of which are hereby incorporated by reference in their entireties, including any figures, tables, or drawings.

This invention was made with government support under a grant awarded from the NSF under grant number BES0423557. The government has certain rights in the invention.

BACKGROUND OF THE INVENTION

Fast scanning micromirrors and microlenses with large vertical displacement (LVD) ranges are desired in a variety of applications, such as wave-front shaping in adaptive optics, interferometry systems, and spatial light modulators. Recently, endoscopic optical coherence tomography (OCT), optical coherence microscopy (OCM), nonlinear optical imaging, and confocal microscopy are emerging as powerful biomedical imaging modalities. These imaging modalities typically require hundreds of microns of vertical displacement for platforms incorporated with the micromirrors and/or microlenses. In OCM and confocal microscopy imaging systems, the vertical scanning ranges of the microlens's focal plane should be 200 μm up to about 2 mm, for example. Linear translating retroreflectors can be dispersion-free and polarization-insensitive, but are typically bulky and slow. The Fourier domain rapid scanning optical delay line (RSOD) can achieve several kHz scans, but it is complex and lossy and requires dispersion compensation. Most existing OCT systems perform image scanning of samples by moving an OCT probe or rotating the distal end of an optical fiber, which is slow and has non-uniform optical coupling.

Currently, two main actuation mechanisms are used to obtain large vertical displacement of the micromirrors and microlenses for OCT, OCM, and confocal microscopy. The first is electrostatic actuation, which can only provide tens of microns of scanning range. The driving voltages required are usually hundreds of volts; thus, such actuation is generally not suitable for biomedical applications. The second is electrothermal actuation, which is capable of hundreds of microns vertical scanning at low driving voltages. These electrothermal actuators conventionally have two sets of complementarily-oriented thermal bimorph beams, which have as a goal to keep the mirror plate or lens holder parallel to the substrate and take advantage of the large vertical displacement at the tip of the long rotational beams.

However, the designs using electrothermal actuation to date have had a serious lateral shift problem. As an example, a particular LVD microlens used for confocal microscopy can generate a maximum 0.71 mm vertical displacement, but has a lateral shift as large as 0.42 mm Such large lateral shifts tend to greatly distort the microscopic image. The lateral shift in LVD micromirrors also significantly reduces the effective optical aperture size. Another disadvantage of the previous LVD designs using electrothermal actuation is that a certain ratio of the driving voltages for the two complementary actuators needs to be maintained in order to obtain a purely vertical motion during the actuation.

Thus, a need remains for a microactuator that is capable of providing a large vertical displacement with reduced tilting and/or reduced lateral shift.

BRIEF SUMMARY

Embodiments of the invention relate to a method and apparatus for vertically displacing a platform relative to a substrate. Displacement of a platform relative to a substrate is often referred to as vertical displacement even when the platform is being displaced sideways. The actuation is based on bimorph (or bi-layer) structures which generate motions when temperature changes. The bimorph structures can also incorporate one or more added layers for mechanical support and/or providing an additional thermal expansion coefficient. The temperature-induced motion is caused by the thermal expansion coefficient difference of the two materials forming the bimorphs. The large displacement is achieved by using the angular amplification of a rotating rigid frame. The large vertical displacement is achieved by using a pair of bimorph beams which compensate each other's rotation and produce a translational vertical motion. The translational vertical motion can also be referred to as translational motion of the platform or other structure, attached to or moved by the third bimorph toward or away from a substrate or other structure the first bimorph is attached to or positioned on. The lateral shift of the platform during displacement can be controlled and, in a specific embodiment, is preferably small. In a preferred embodiment, the lateral displacement is negligible during displacement. In a specific embodiment, negligible lateral displacement can be achieved by using three bimorphs. Further embodiments can incorporate more than three bimorphs. The tilting of the platform during displacement can be controlled and, in a specific embodiment, the platform is parallel to the top surface of the substrate after displacement.

In specific embodiments, one-dimensional (1D) or 2D angular scanning of the platform can also be achieved by selectively activating the bimorphs of the device.

Embodiments of the invention also pertain to a method and apparatus for endoscopic optical coherence tomography (OCT), optical coherence microscopy (OCM), nonlinear optical (NLO) imaging, and/or confocal microscopy. Such embodiments can incorporate a method and apparatus for displacing a platform relative to a substrate in accordance with embodiments of the invention.

An embodiment of a microactuator for displacing a platform vertically with respect to a substrate includes a first rigid frame, a first flexible bimorph beam connecting the first frame to the substrate, a second rigid frame, a second flexible bimorph beam connecting the second frame to the first frame, and a third flexible bimorph beam connecting a platform to the second frame. Activation of the first, second, and third flexible bimorph beams causes vertical displacement of the platform with respect to the substrate. Preferably, the vertical displacement is achieved with negligible lateral shift.

A specific embodiment of a microactuator assembly includes a substrate, a plurality of first rigid frames, a plurality of first flexible bimorph beams, a plurality of second rigid frames, a plurality of second flexible bimorph beams, a platform, and a plurality of third flexible bimorph beams. Actuation of the first, second, and third pluralities of bimorph beams causes vertical displacement of the platform with respect to the substrate. In this way, the amount of lateral shift that occurs during the vertical displacement can be controlled. In a preferred embodiment, the vertical displacement is achieved with negligible lateral shift.

A specific embodiment incorporates four identical microactuator assemblies, for example, as described above, that are located respectively at the four sides of a central platform. Simultaneous activation of the four microactuators moves the central platform vertically without tilting and lateral shift. Selective activation of one or two adjacent microactuators generates tip-tilt motions, such that 1D and 2D angular scanning of the platform can be achieved. Other embodiments incorporate one, two, three, or more microactuator assemblies, attached to one or more sides, or other locations, of the platform.

Figure 1A:
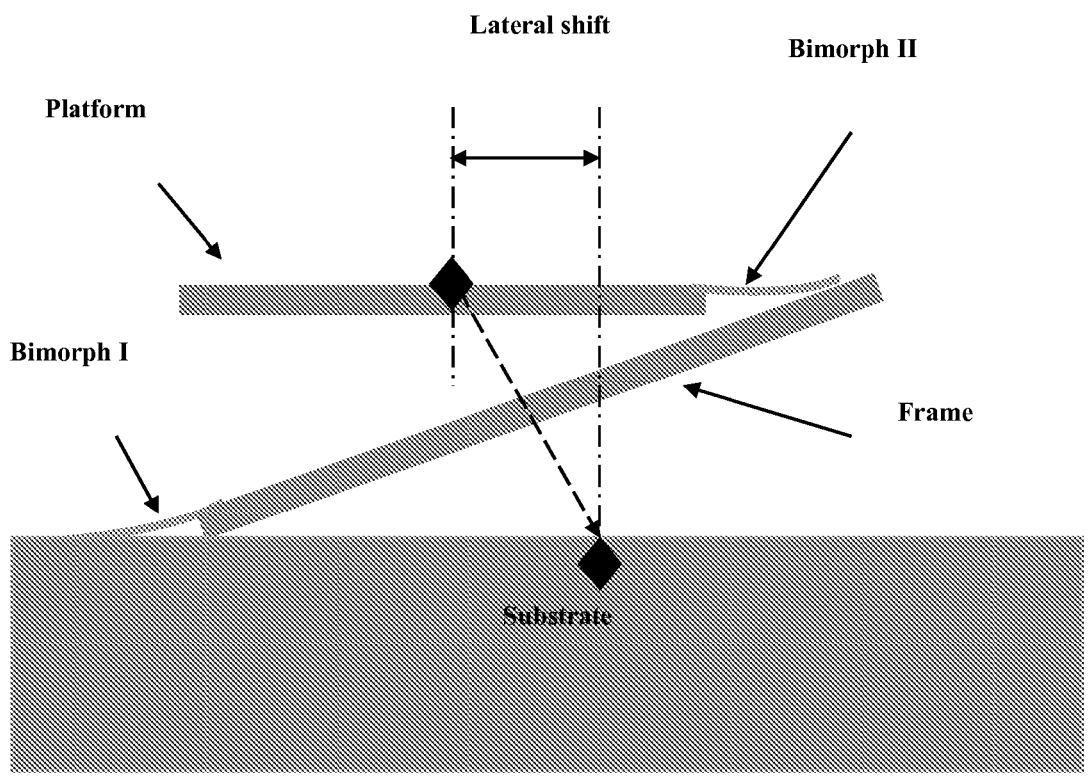
FIG. 1A is an elevation view of a large-vertical-displacement (LVD) microactuator with lateral shift.

The figures may not be drawn to scale. Moreover, where directional terms (such as above, over, left, right, under, below, etc.) are used with respect to the illustrations or in the discussion, they are used for ease of comprehension only and not as limitations. The elements of the devices may be oriented otherwise, as readily appreciated by those skilled in the art.

DETAILED DISCLOSURE

Embodiments of the invention relate to a method and apparatus for vertically displacing a platform relative to a substrate. Displacement of a platform relative to a substrate is often referred to as vertical displacement even when the platform is being displaced sideways. The lateral shift of the platform during displacement can be controlled and, in a specific embodiment, is preferably small. In a preferred embodiment, the lateral displacement is negligible during displacement. The tilting of the platform during displacement can be controlled and, in a specific embodiment, the platform is parallel to the top surface of the substrate after displacement.

Embodiments of the invention also pertain to a method and apparatus for endoscopic optical coherence tomography (OCT), optical coherence microscopy (OCM), nonlinear optical (NLO) imaging, and/or confocal microscopy. Such embodiments can incorporate a method and apparatus for displacing a platform relative to a substrate in accordance with embodiments of the invention.

Embodiments of a method and apparatus incorporate an electrothermal large vertical displacement (LVD) actuator design that can generate up to, or more than, a half millimeter vertical displacement. Preferably, the vertical displacement is achieved with negligible lateral shift and tilting angle. Further embodiments can achieve up to 1 mm, up to 1.5 mm, or up to 5 mm vertical displacement. In a specific embodiment, a lateral-shift-free (LSF) LVD microactuator design greatly simplifies the driving of the device by using only one driving voltage for vertical motion actuation. In an exemplary embodiment, the design of the LSF-LVD actuator include four actuators where each of the four actuators includes the following: 1) three bimorph beams used to compensate for the angular motion; 2) two frames connected between the three beams, such that the frames rotate oppositely to compensate for the lateral shift while still taking advantage of large vertical displacement at the tips; and 3) heaters (e.g., platinum) embedded all along the beams and the frames for uniform heating of the bimorph beams. Each of the four identical actuators incorporating the three beams and two frames are placed at the edges of a square-shaped platform. By embedding the heaters along the beams and frames, the temperature on the three bimorph beams of each microactuator can be maintained the same by a single driving voltage, thus a vertical displacement at the end of each microactuator can be obtained by a single driving voltage. Other materials can be used as heaters other than platinum such as chrome and polysilicon. In this embodiment, a symmetric structure is formed and, thus, by simultaneously actuating the four identical microactuators, the residual tilting caused by the temperature difference and fluctuation on the bimorph beams can be compensated and a purely vertical motion can be obtained on the platform. Angular scanning motion of the platform can also be achieved from the same embodiment. Actuating one actuator or two adjacent actuators of the four microactuators at the four sides of the platform, results in vertical displacement at the corresponding sides of the platform. Thus, 1D or 2D angular scanning of the platform can be obtained.

In another embodiment, the platform has actuators only on two sides. The actuator on each side may be a single microactuator or a plurality of the microactuators. In case of plural microactuators, the numbers of microactuators on both sides may be the same or different.

In alternative embodiments, the platform can be other shapes than square, the individual actuators can be driven in subgroups and/or individually, more or less than four individual actuators can be attached to the platform, the bimorph beams and frames of the different individual actuators can be of different lengths, widths, or other properties, and/or the bimorph beams can have different properties.

Figure 1B:
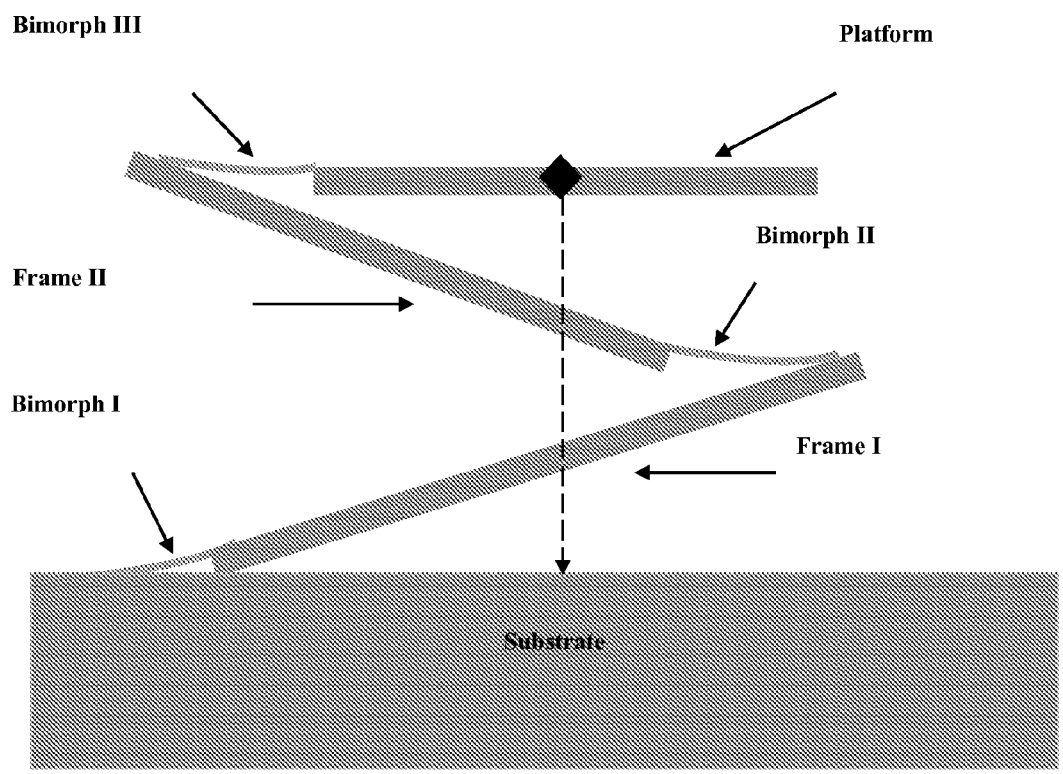
FIG. 1B is an elevation view of an exemplary embodiment of a lateral-shift-free (LSF) LVD microactuator of the present disclosure.
Figure 1C:
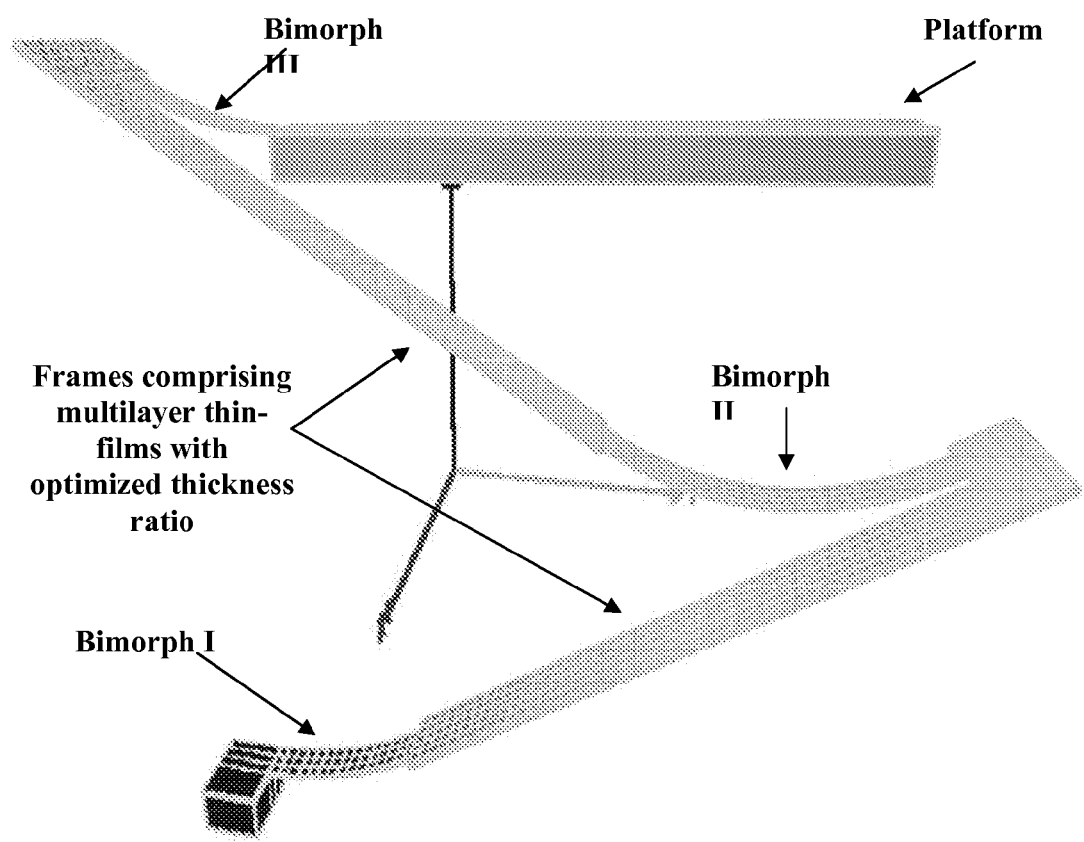
FIG. 1C shows an embodiment incorporating $SiO_2$/Pt/Al/$SiO_2$ multilayer thin films with optimized thickness ratios.

FIG. 1A is an elevation view of a conventional LVD microactuator, which suffers lateral shift upon vertical displacement. In comparison, FIG. 1B is an elevation view of an exemplary embodiment of a LSF-LVD microactuator in accordance with the present disclosure. In the embodiment shown in FIG. 1B, the platform, which in exemplary cases is a mirror or lens holder, is connected to the last set of bimorph beams. The frames and the platform have single-crystal silicon (SCS) underneath to provide structural rigidity and avoid expansion upon heating. In another embodiment, as shown in FIG. 1C, the first and second frames incorporate $SiO_2$/Pt/Al/$SiO_2$ multilayer thin films with optimized thickness ratios to maintain the flatness upon heating, which still takes advantage of the amplified out-of-plane displacement at tip of the flat frame but avoids using thick Si layer for the purpose of a faster thermal response. A platinum (Pt) heater is embedded in all the bimorph beams for a uniform and efficient heating. $SiO_2$ meshes are used to provide good thermal isolation, such as isolating a mirror plate on the platform from the heaters. The tilt of the platform can be controlled by the rotation angles of the three bimorph beams, and the lateral shift can be minimized by properly choosing the lengths of the frames and bimorph beams. The conditions for a flat and LSF platform can be derived from the geometry design shown in FIG. 2.

In order to keep the platform parallel to the substrate surface during the actuation, the rotation angles of the three bimorph beams should satisfy the following relation:

$$\theta_2 = \theta_1 + \theta_3. \quad (1)$$

where $\theta_1$, $\theta_2$ and $\theta_3$ are the arc angles of the three bimorphs and are proportional to the bimorph lengths and temperatures. If a uniform temperature is obtained on all the bimorph beams, the arc angles will be directly proportional to the bimorph lengths. Thus, Eq. (1) becomes $l_2 = l_1 + l_3$. For simplicity, in an embodiment, $l_1$ and $l_3$ can be chosen as half of $l_2$ to maintain a flat platform, i.e., $$l_1 = l_3 = l_2/2. \quad (2)$$

This also yields $$\theta_1 = \theta_3 = \theta_2/2. \quad (3)$$

Figure 2:
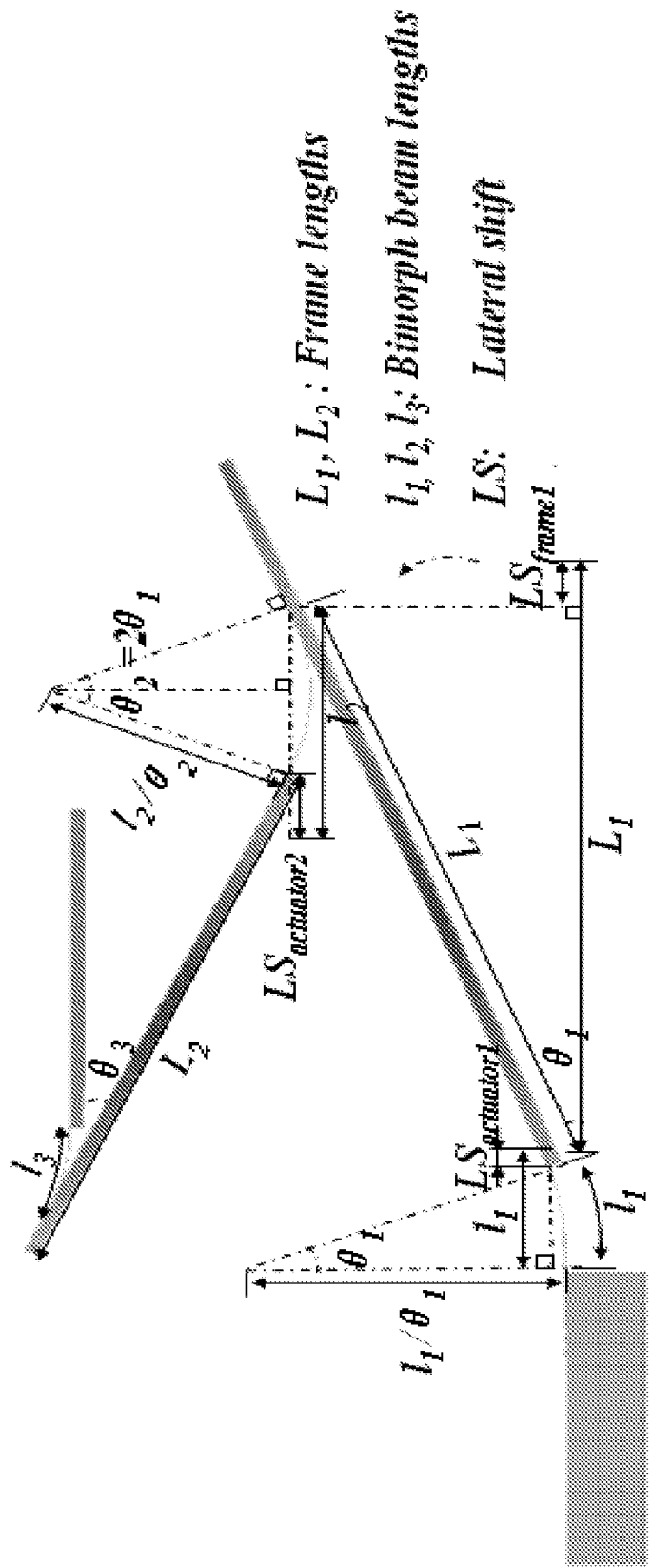
FIG. 2 illustrates the geometry design conditions for a flat and LSF platform.

For a leveled platform, in the embodiment shown in FIG. 2, there are five components contributing to the lateral shift: Actuator 1, Frame 1, Actuator 2, Frame 2 and Actuator 3. Assuming each bimorph beam has a uniform curvature, the lateral shift of each component can be expressed as $$LS_{actuator1} = l_1 - l_1(\sin\theta_1)/\theta_1, \quad (4)$$

$$LS_{frame1} = L_1 - L_1\cos\theta_1, \quad (5)$$

$$LS_{actuator2} = l_2 - 2l_2(\sin\theta_1)/\theta_2, \quad (6)$$

$$LS_{frame2} = L_2 - L_2\cos\theta_1, \quad (7)$$

$$LS_{actuator3} = l_3 - l_3(\sin\theta_3)/\theta_3, \quad (8)$$

where $L_1$ and $L_2$ are the lengths of Frame 1 and Frame 2, respectively.

By plugging Eqs. (2)-(3) into Eqs. (4)-(8), the total lateral shift of the platform is given by:

$$\begin{aligned} LS &= LS_{actuator1} + LS_{frame1} - LS_{actuator2} - LS_{frame2} + LS_{actuator3} \quad (9) \\ &= (L_1 - L_2)(1 - \cos\theta_1) \end{aligned}$$

Thus, the lateral shift and the tilting of the platform can be controlled by selection of $L_1$ and $L_2$ for the case of $l_2/2 = l_1 = l_3$ and $\theta_1 = \theta_3 = \theta_2/2$. In a specific embodiment for the case of $l_2/2 = l_1 = l_3$ and $\theta_1 = \theta_3 = \theta_2/2$, the lateral shift can be substantially eliminated by simply choosing the same length for the two frames and the lengths of the bimorph beams to satisfy Eq. (2).

Figure 3A:
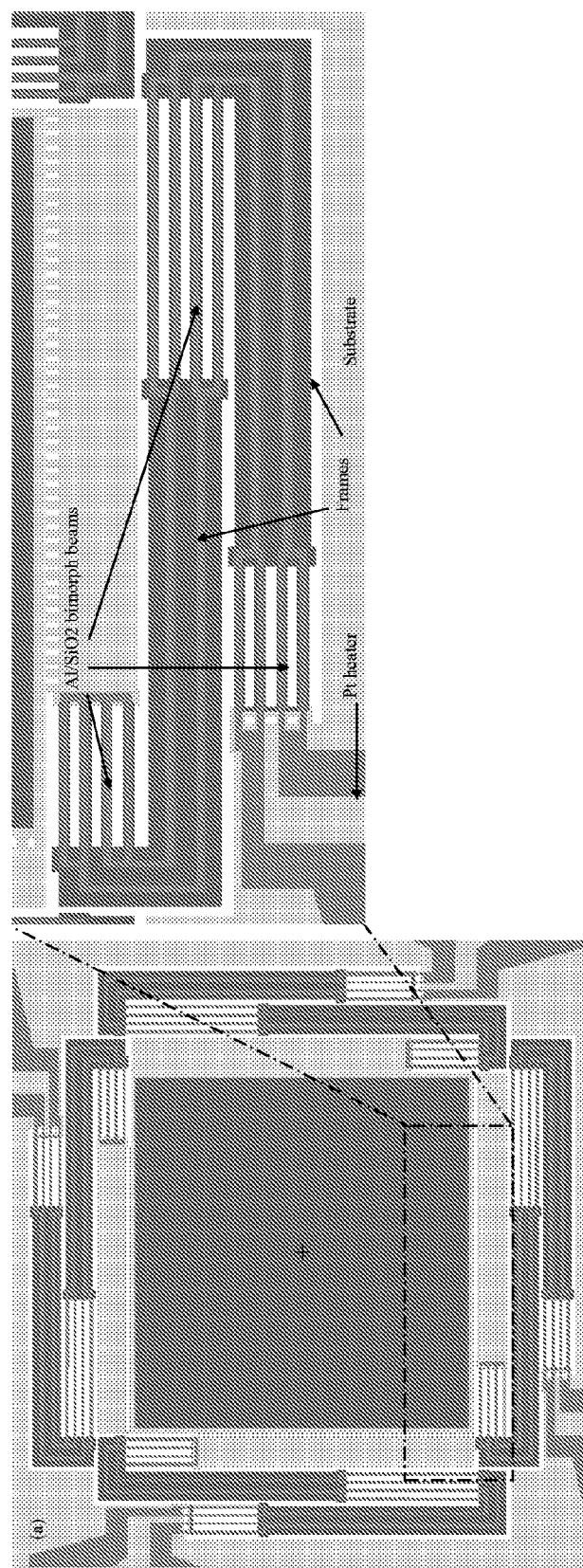
FIG. 3A shows the layout of an exemplary optimized structure using four sets of identical actuators, one at each side of a square platform.
Figure 3B:
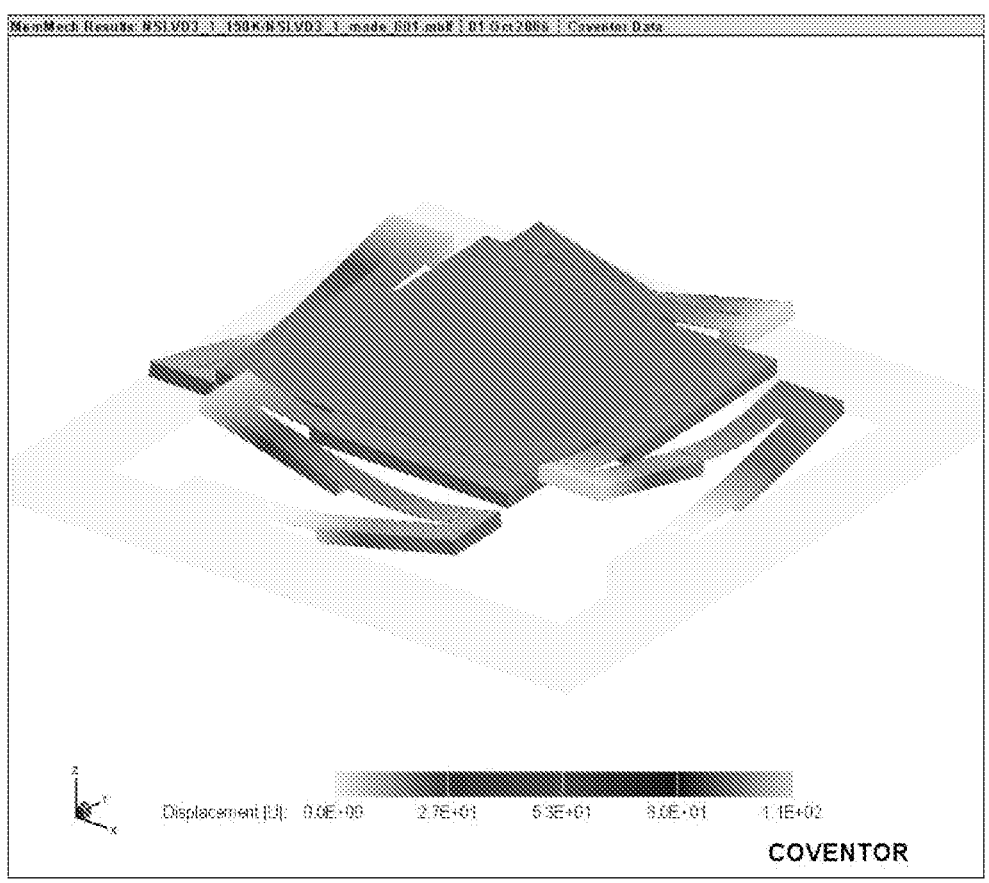
FIG. 3B shows simulation results in Coventorware of the LSF-LVD design as shown in FIG. 3A at room temperature.
Figure 3C:
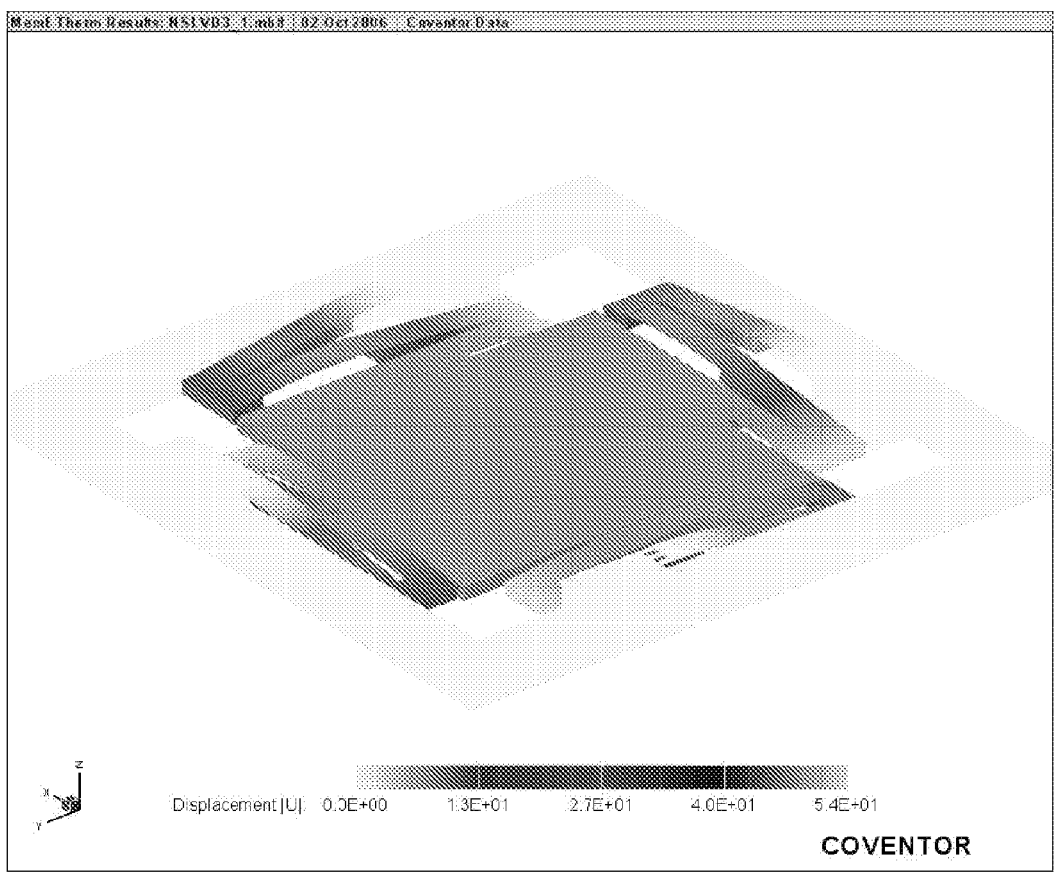
FIG. 3C shows simulation results in Coventorware of the vertical displacement motion with four actuators being actuated simultaneously by equal voltages.

FIG. 3A shows the layout of an exemplary optimized symmetric structure with four sets of identical LVD actuators, one at each side of a square platform. With each actuator having a uniform heater, the four actuators can be driven simultaneously with a single driving voltage to maintain a purely vertical motion. FIGS. 3B and C show simulation results in Coventorware modeling software to verify the LSF-LVD structure design of the device of FIG. 3A, in which FIG. 3B is the simulation result of the structure at room temperature with no actuators being actuated, and FIG. 3C is the simulation result with all four actuators being actuated simultaneously by equal voltages. A purely vertical motion mode of the platform is demonstrated.

Figure 3D:
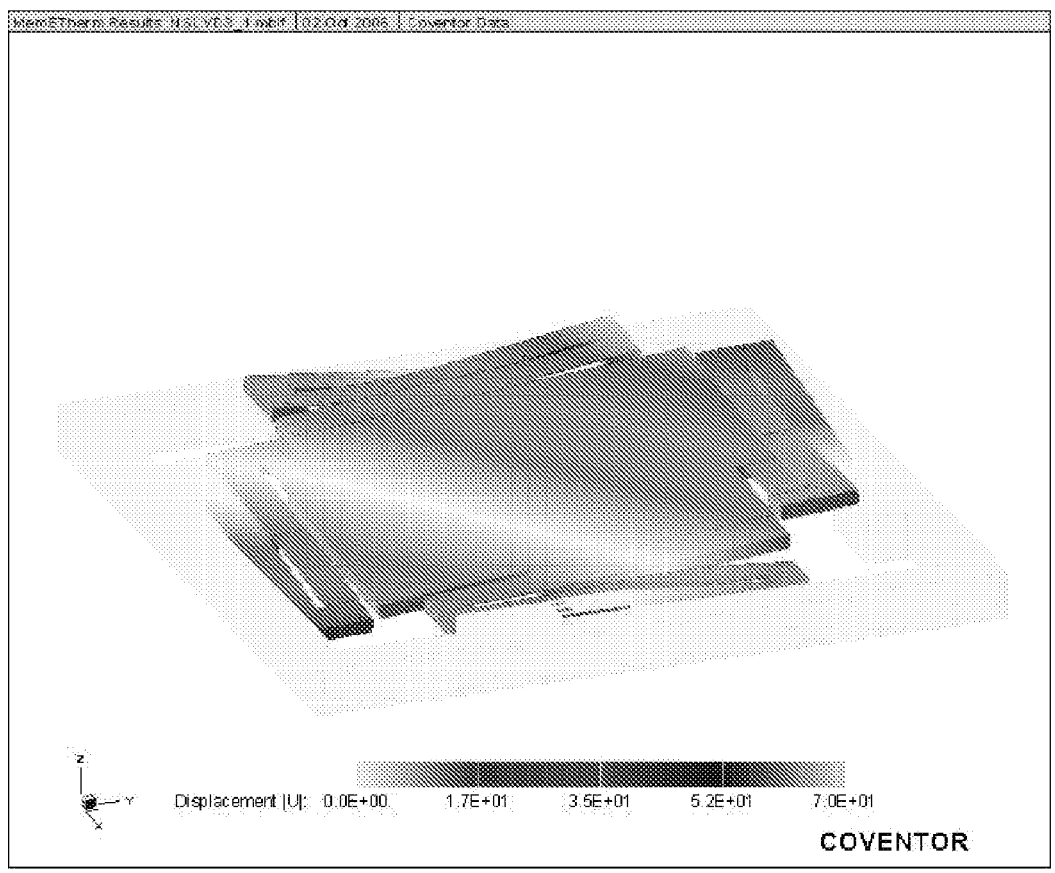
FIG. 3D shows simulation result in Coventorware of the tip-tilt motion of the same design with only one actuator being actuated.
Figure 3E:
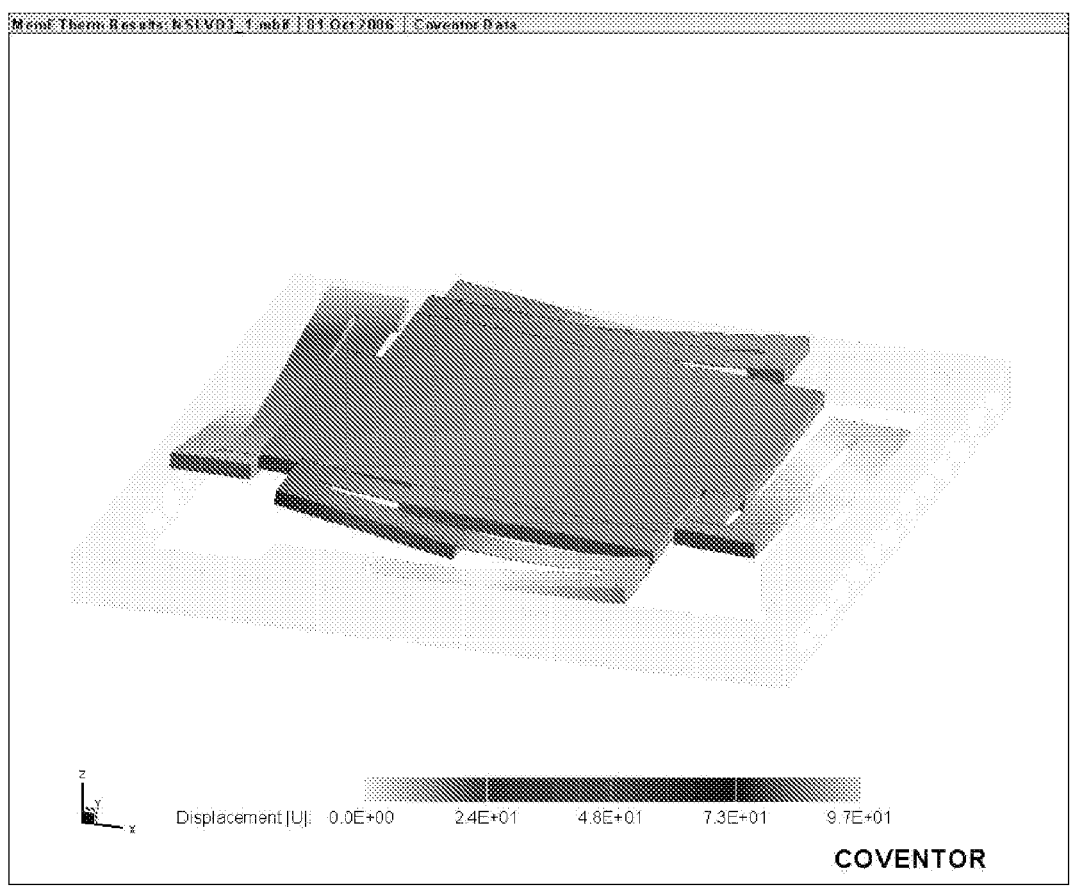
FIG. 3E shows the simulation result in Coventorware of the tip-tilt motion of the same design with two adjacent actuators being actuated.

Tip-tilt motion can be also obtained from the same microactuator assembly as in FIG. 3A. FIGS. 3D and E show the Coventorware simulation results of the same design with one and two adjacent actuators being actuated, in which the corresponding platform edges displace downward thus the platform exhibits a tip-tilt motion with controlled tilting angles.

In alternative embodiments, such as when lateral shift and/or platform tilting is desired upon displacement, the actuators can be driven separately, in pairs, or otherwise use multiple voltage sources. In a further embodiment, the four actuators can be driven by multiple voltage sources and the multiple voltage sources can be controlled to control the tilt angle, vertical displacement, and lateral shift of the platform. Further, the relationship between $\theta_1$, $\theta_2$, and $\theta_3$, and $l_1$, $l_2$, and $l_3$ can be adjusted as well to control the tilt angle, vertical displacement, and lateral shift of the platform.

With specific embodiments of an LSF-LVD actuator design in accordance with the subject invention, axial scanning can be precisely controlled for OCM and confocal microscopy. By controlling the axial scanning, three dimensional imaging via OCT systems can also be enabled, such as with endoscopic catheters.

Applications for embodiments of the subject microactuators include their use as key elements in miniature endoscopic imaging probes for in vivo diagnosis of early cancers including lung, bladder, colon, and gastrointestinal cancers and in miniature cardiovascular imaging catheters for plaque detection and intervention. Other applications include the use of embodiments of the subject microactuators as axial scanning micromirrors for optical delay lines in miniature OCT and OCM imaging probes and axial scanning microlens for OCM and confocal microscopy imaging probes.

Figures 4A, 4B:
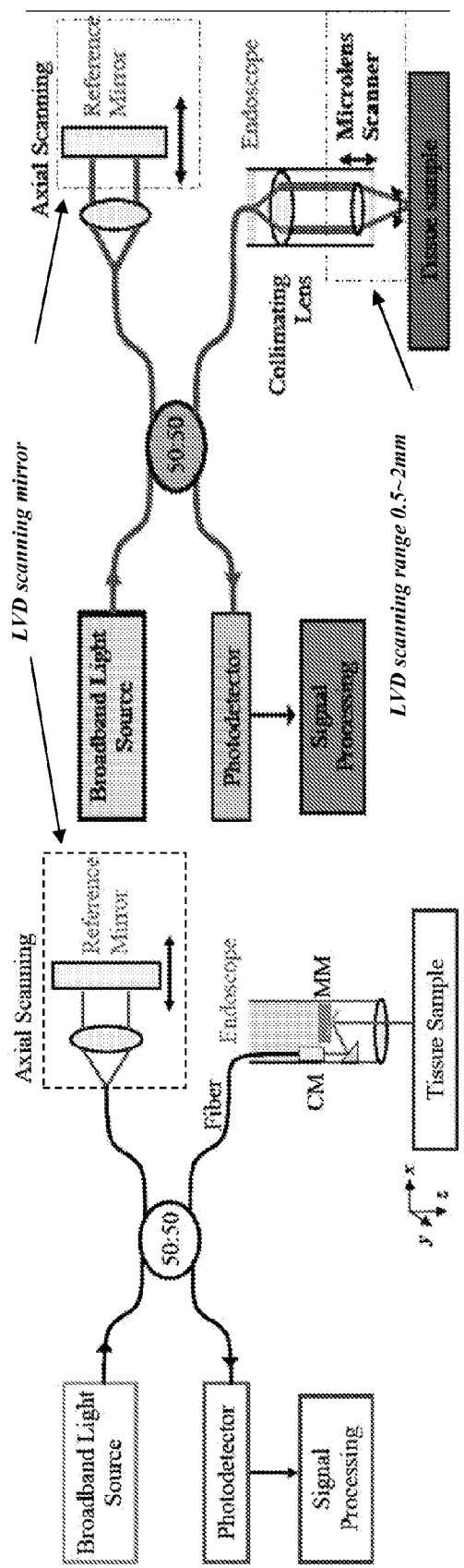
FIG. 4A shows a schematic diagram of an exemplary configuration for optical coherence tomography.
FIG. 4B shows a schematic diagram of an exemplary configuration for optical coherence microscopy.
Figure 4C:
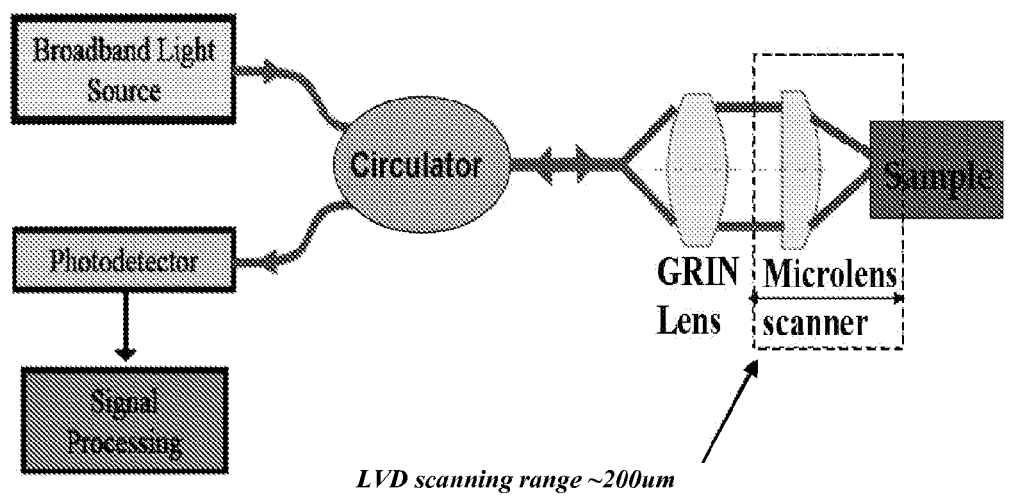
FIG. 4C shows a schematic diagram of an exemplary configuration for confocal microscopy.

FIGS. 4A-C show the schematics of classical setups of (FIG. 4A) microelectromechanical-(MEMS)-based endoscopic optical coherence tomography; (FIG. 4B) MEMS-based endoscopic optical coherence microscopy; and (FIG. 4C) MEMS-based endoscopic confocal microscopy, representing the most applicable elements in those systems to embodiments of the LVD microactuator in accordance with the subject invention. The LSF-LVD micromirror can be used for axial scanning both in OCT and OCM systems. The LSF-LVD scanning microlens can be used in the OCM, nonlinear optical imaging, and confocal microscopy systems. The LSF-LVD micromirrors can be used for lateral scanning in OCT, OCM, nonlinear optical imaging, and confocal microscopy.

Figure 5:
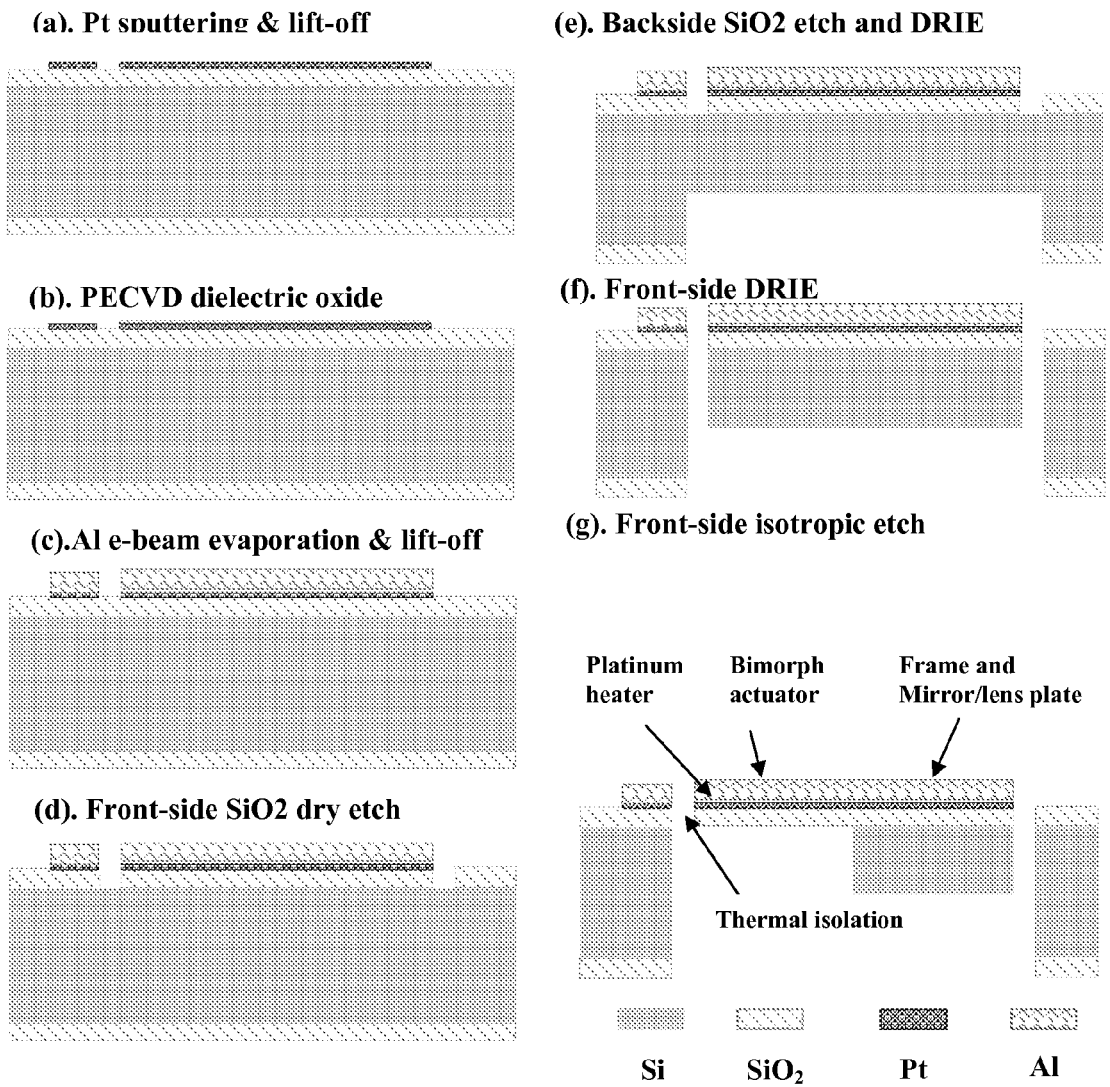
FIG. 5 shows an exemplary fabrication process for an embodiment of a microactuator of the present disclosure.

The device can be fabricated by a combined surface- and bulk-micromachining batch process. FIG. 5 shows an exemplary fabrication process for a microactuator of the present disclosure, starting with Pt sputtering and lift-off to form the heater pattern on a 1 μm thick thermal $SiO_2$ coated wafer (a). Steps (b) and (c) show a plasma enhanced chemical vapor deposition (PECVD)-formed $SiO_2$ (~0.1 μm) layer and e-beam Al layer (~1 μm) being deposited and patterned. A $SiO_2$ plasma etch is performed to expose the front-side Si (d). A backside $SiO_2$ etch and a deep silicon etch are performed to form a ~20 μm thick SCS platform (e). After that, a front-side deep silicon trench etch, followed by a silicon undercut, is used to release the microstructure (f). Other fabrication techniques can also be used and are known to those skilled in the art.

Figure 6A:
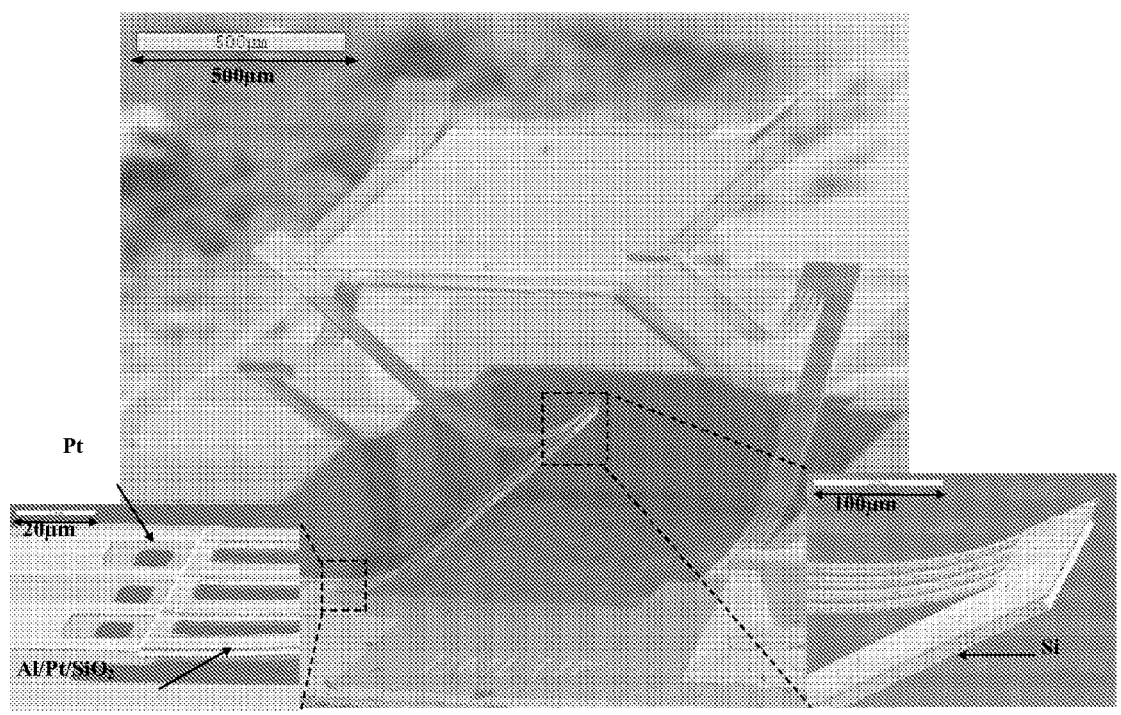
FIG. 6A is a scanning electron microscope (SEM) image of a fabricated embodiment of an LSF-LVD micromirror in accordance with the subject invention, with insets showing the Pt heater, Al/SiO2 bimorph beams, and frames.
Figure 6B:
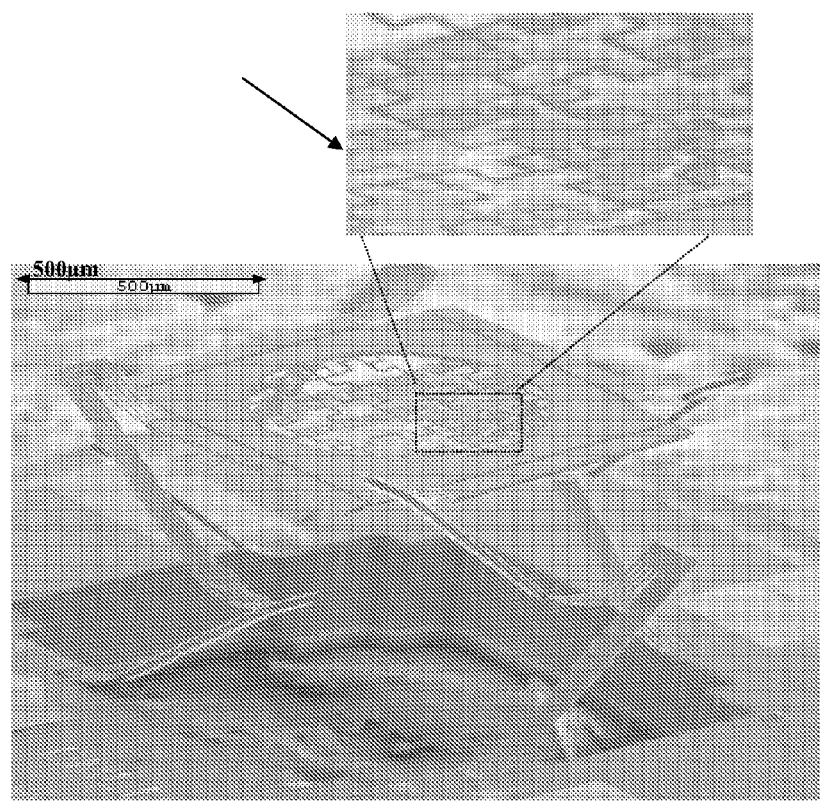
FIG. 6B is a SEM image of a fabricated embodiment of an LSF-LVD microlens holder in accordance with the subject invention, with an inset showing the meshed $SiO_2$ lens holder (polymer lens not shown).
Figure 6C:
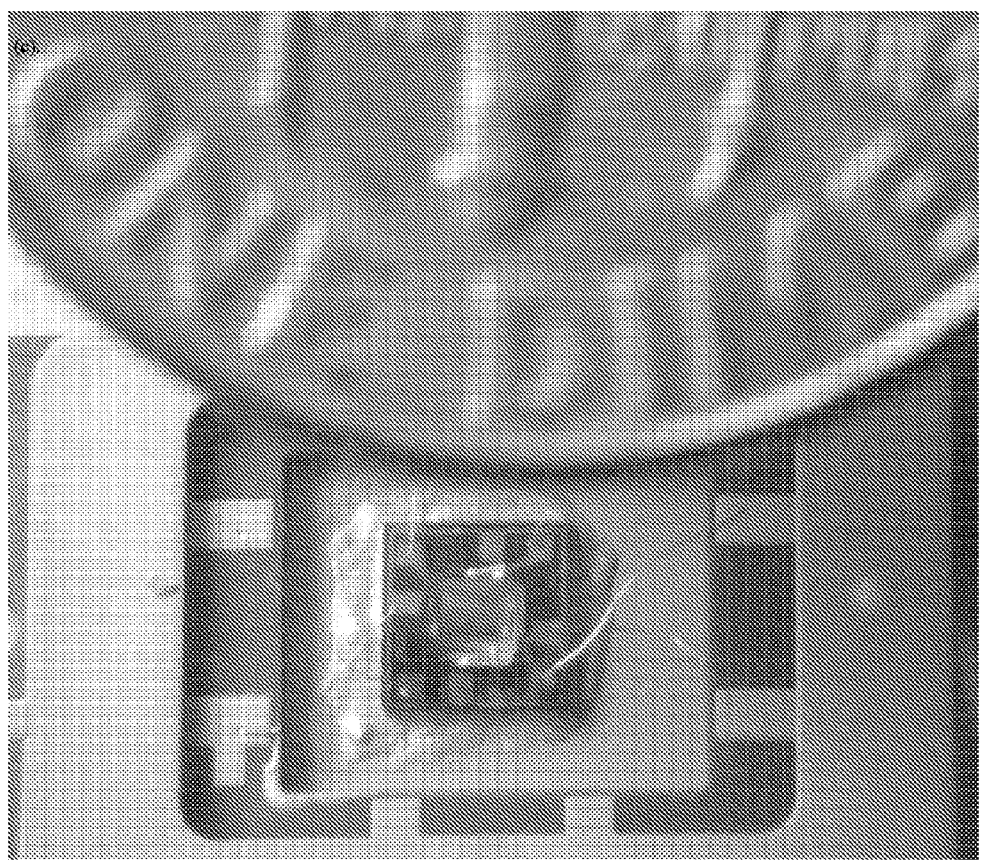
FIG. 6C is a SEM image of a wire bonded device in accordance with the invention, with a U.S. dime.
Figure 6D:
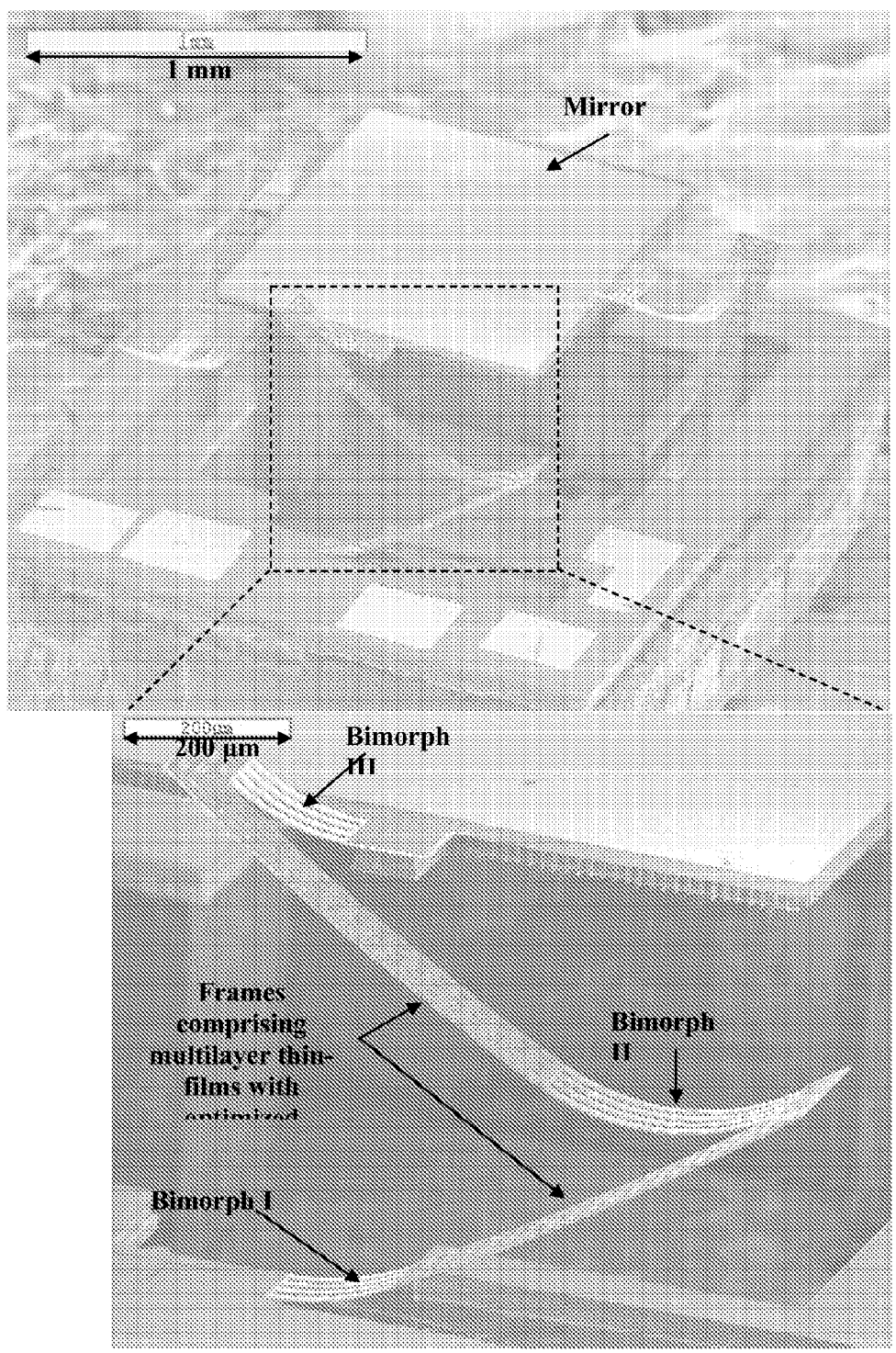
FIG. 6D shows an SEM image of a fabricated LSF-LVD micromirror with the first and second frames incorporating $SiO_2$/Pt/Al/$SiO_2$ multilayer thin films, in accordance with an embodiment of the invention.

FIG. 6A is a scanning electron microscope (SEM) image of a fabricated LSF-LVD micromirror with insets showing the Pt heater, Al/SiO2 bimorph beams, and frames. FIG. 6B is a SEM image of a fabricated LSF-LVD microlens holder with an inset showing the meshed $SiO_2$ lens holder (polymer lens not shown). FIG. 6C is a SEM image of a wire bonded device with a U.S. dime. FIG. 6D shows an SEM image of a fabricated LSF-LVD micromirror with the first and second frames incorporating SiO2/Pt/Al/SiO2 multilayer thin films.

Figure 7A:
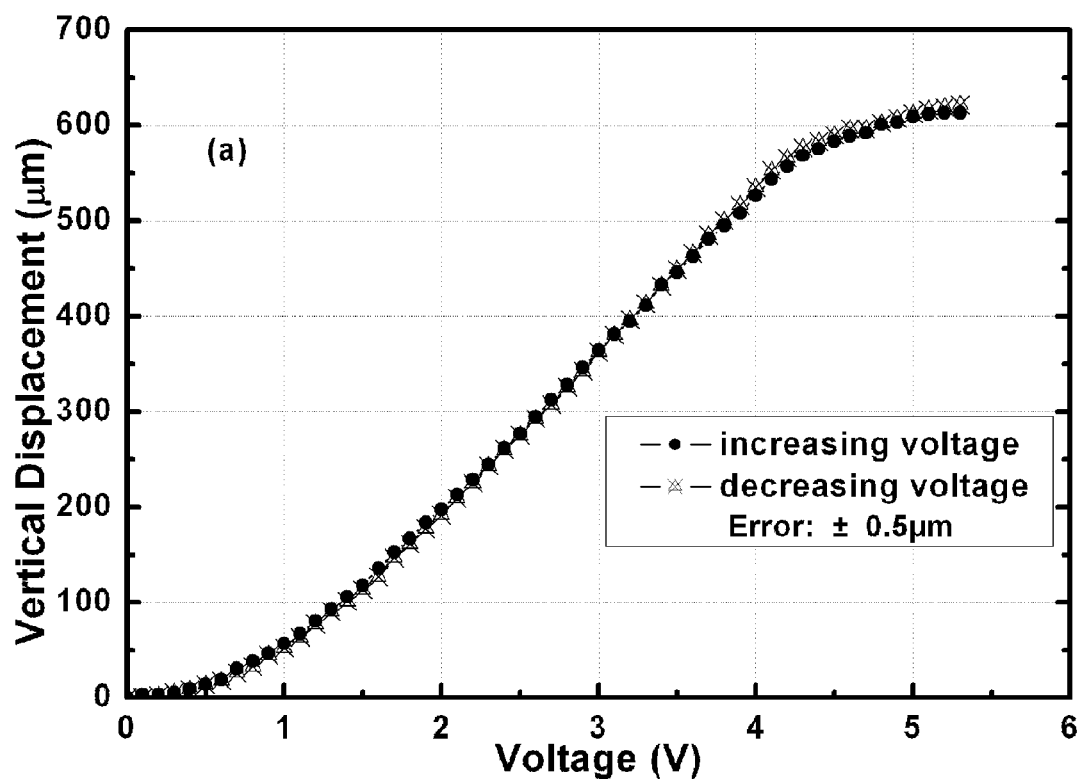
FIG. 7A is a graph showing vertical displacement performance of an exemplary device in accordance with the subject invention.
Figure 7B:
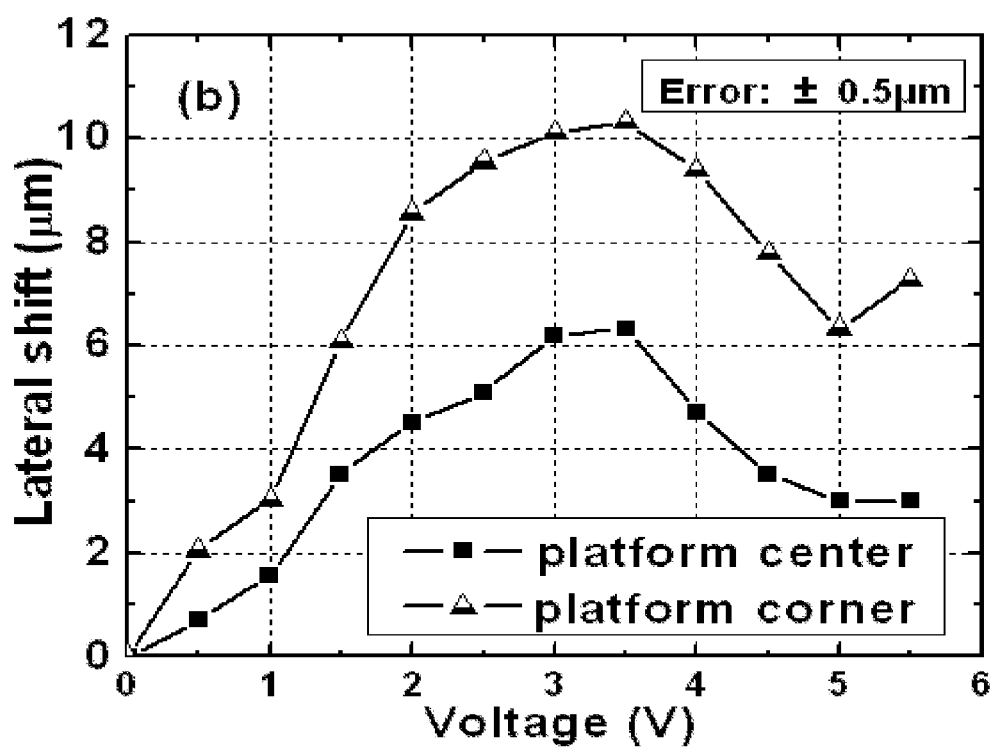
FIG. 7B is a graph showing lateral shift performance of an exemplary device in accordance with the subject invention.
Figure 7C:
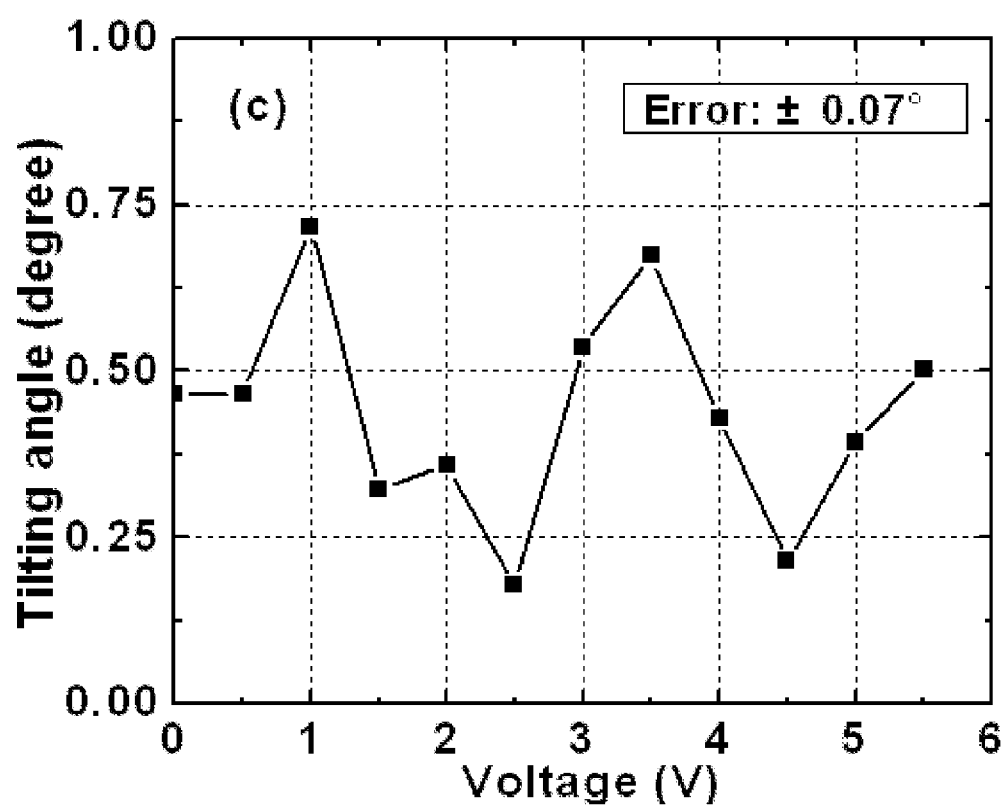
FIG. 7C is a graph showing tilting angle performance of an exemplary device in accordance with the subject invention.
Figure 8:
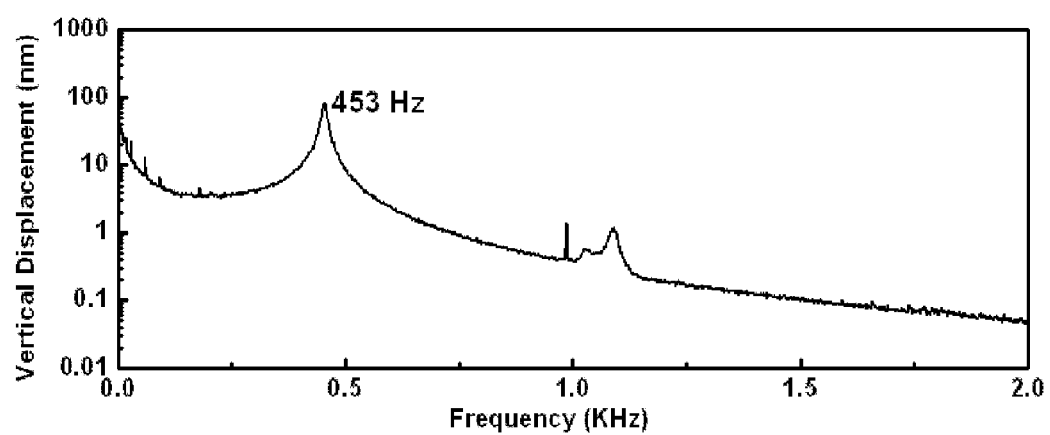
FIG. 8 is a graph showing the measured frequency response of an exemplary LSF-LVD micromirror device in accordance with the subject invention.

The performance of a fabricated LSF-LVD micromirror, including the vertical displacement, lateral shift, and tilting angle, has been characterized using an Olympus BX51 microscope and a QC200 geometry measuring system, with d.c. voltages being applied to the four actuators simultaneously. The device has a 0.8 mm mirror size and a 2.5 mm device footprint. It exhibited an initial elevation of the mirror plate of about 646 μm due to the residual stresses and the temperature coefficient of expansion (TCE) difference of the two materials. A large vertical displacement as high as 621 μm has been obtained at only 5.3 Vdc (184 mW), as shown in FIG. 7A. FIG. 7B and FIG. 7C show the measured lateral shifting and tilting angle, with the maximum values of only about 10 μm and 0.7° respectively during the entire vertical scanning range. The frequency responses have been measured using a Polytec OFV-511 laser Doppler vibrometer, with an applied voltage of (1+0.5 sin ωt) V, as shown in FIG. 8. The first resonance peaks are observed at 453 Hz, which correspond to the vertical motion resonance mode.

Figure 9:
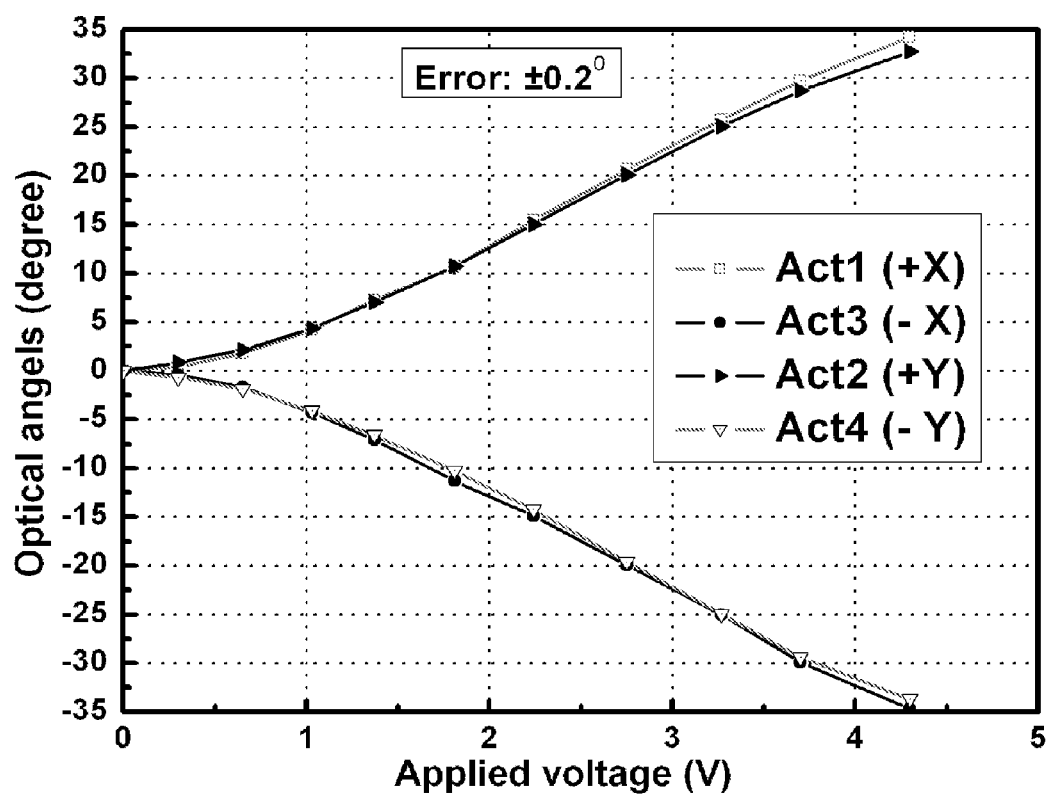
FIG. 9 shows the static scanning performances by actuating each actuator of an exemplary device.

The tip-tilt motion of the same design has been verified experimentally. An experimental setup with a laser beam incident on the mirror surface and voltage applied to four actuators individually has been used to measure the static scanning angles versus applied voltage on each actuator. As shown in FIG. 9, about 34° optical angles can be obtained from each actuator at only 4.3 Vdc.

Figure 10A:
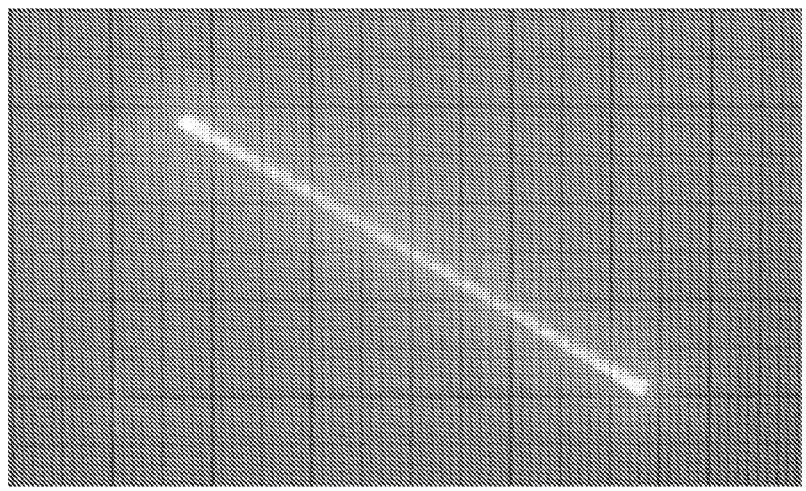
FIGS. 10A-10C shows the dynamic 2D scanning patterns of an exemplary device, in which 10A and 10B show the scanning patterns with different phase shifts in both directions and 10C shows a 15°×30° raster scanning pattern.
Figure 10B:
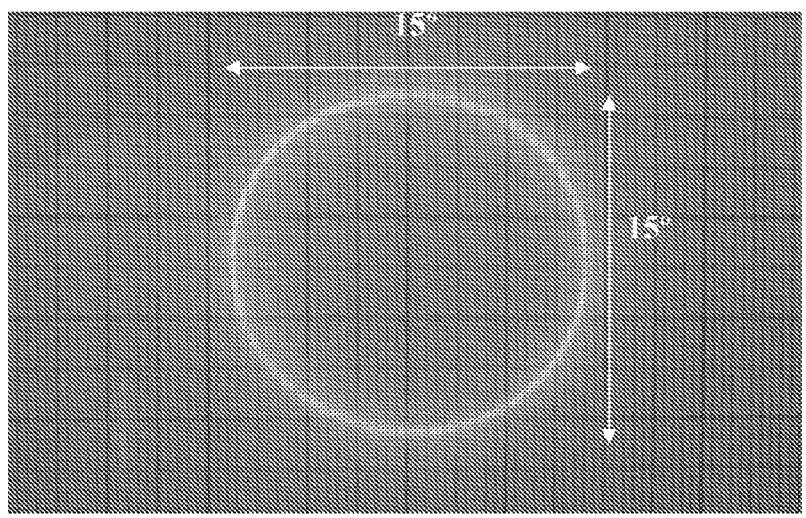
Figure 10C:
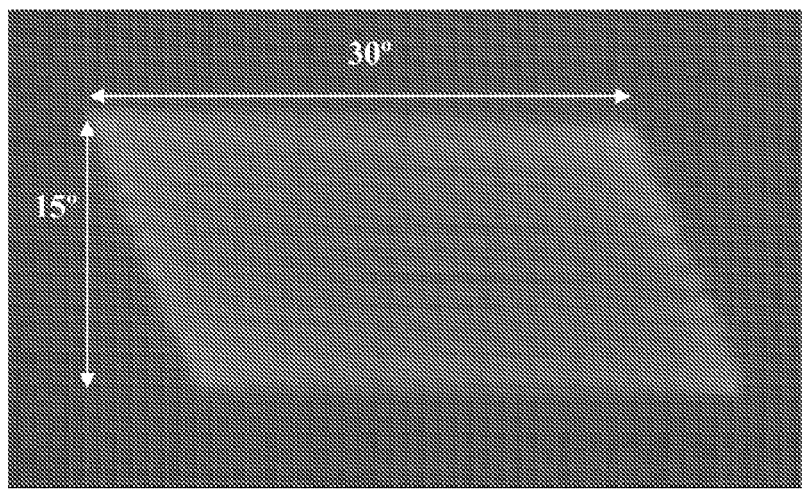

Dynamic 2D scanning was performed by using the same experimental setup for the static scan. By driving the two sets of opposite actuators with two pairs of ac voltages, which respectively are Vp(1+sin(ωt)) and Vp(1−sin(ωt)), the two opposite sides of the mirror plate in each direction can be excited alternatively with a fixed 180° phase shift. Thus, an optical scanning range of more than ±30° can be obtained independently in both axes with controlled piston motion and no lateral center shift. FIGS. 10A and B show the scanning patterns with different phase shifts of the two ac voltage pairs for both directions. FIG. 10C shows a 15°×30° raster scanning obtained by driving one axis at resonant frequency (fast scan) with Vp=1.5V and the other at 47 Hz (slow scan) with Vp=3.5V.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. A microactuator, comprising:
   a first frame;
   a first beam connecting the first frame to a substrate, wherein the first beam comprises at least two first layers having different materials such that the first beam changes shape when a temperature of the first beam changes;
   a second frame;
   a second beam connecting the second frame to the first frame, wherein the second beam comprises at least two second layers having different materials such that the second beam changes shape when a temperature of the second beam changes; and
   a third beam connected to the second frame, wherein the third beam comprises at least two third layers having different materials such that the third beam changes shape when a temperature of the third beam changes, wherein activation of at least one of the first, second, and third beams causes movement of the third beam with respect to the substrate, wherein projections of the first beam, the second beam, and the third beam onto the substrate are parallel.

2. The microactuator according to claim 1, further comprising a platform connected to the third beam, wherein activation of the at least one of the first, second, and third beams causes movement of the platform with respect to the substrate.

3. The microactuator according to claim 1, wherein two of the at least two first layers have coefficients of thermal expansion that differ by a factor of at least 5.

4. The microactuator according to claim 1, wherein two of the at least two first layers have coefficients of thermal expansion that differ by a factor of at least 10.

5. The microactuator according to claim 1, wherein two of the at least two first layers have coefficients of thermal expansion that differ by a factor of at least 20.

6. The microactuator according to claim 3, wherein the first beam, the second beam, and the third beam have the same layer structure and are made of the same materials.

7. The microactuator according to claim 6, wherein the first beam, the second beam, and the third beam flex when heated.

8. The microactuator according to claim 7, where the first beam, the second beam and the third beam flex in the same direction when heated.

9. The microactuator according to claim 1, wherein the first frame is rigid.

10. The microactuator according to claim 9, wherein the second frame is rigid.

11. The microactuator according to claim 2, wherein the activation of the first beam, second beam, and third beam causes the platform to move away from or toward the substrate.

12. The microactuator according to claim 2, wherein the activation of the first beam, second beam, and third beam causes the platform to move away from or toward the substrate without significant lateral movement of the platform with respect to the substrate.

13. The microactuator according to claim 1, wherein the first beam is connected to an outer side of a first end of the first frame, and the second beam is connected to an inner side of a second end of the first frame.

14. The microactuator according to claim 1, wherein one or both of the first frame and the second frame is a closed, rectangular frame.

15. The microactuator according to claim 1, wherein one or both of the first frame and the second frame is a folded rectangular frame.

16. The microactuator according to claim 1, wherein the length of the second beam is equal to the sum of the lengths of the first beam and the third beam.

17. The microactuator according to claim 16, wherein the length of the second beam is twice the length of the first beam and twice the length of the third beam.

18. The microactuator according to claim 1, wherein activation of the at least one of the first, second, and third beams is electrothermal actuation.

19. The microactuator according to claim 2, wherein the movement of the platform comprises tilting of the platform.

20. The microactuator according to claim 2, wherein the movement of the platform comprises rotation of the platform around an axis normal to the substrate.

21. The microactuator according to claim 2, wherein the movement of the platform comprises the platform remaining substantially parallel to the substrate.

22. The microactuator according to claim 1, wherein one or both of the first frame and the second frame comprise multilayer thin films and silicon underneath the multilayer thin films to reduce the curling of the frames upon heating.

23. The microactuator according to claim 1, wherein one or both of the first frame and the second frame comprise multilayer thin films to reduce the curling of the frames upon heating.

24. A microactuator assembly, comprising:
a substrate;
a plurality of microactuators, each microactuator comprising:
a first frame;
a first beam connecting the first frame to a substrate, wherein the first beam comprises at least two first layers having different materials such that the first beam changes shape when a temperature of the first beam changes;
a second frame;
a second beam connecting the second frame to the first frame, wherein the second beam comprises at least two second layers having different materials such that the second beam changes shape when a temperature of the second beam changes; and
a third beam connected to the second frame, wherein the third beam comprises at least two third layers having different materials such that the third beam changes shape when a temperature of the third beam changes, wherein activation of at least one of the first, second, and third beams causes movement of the third beam with respect to the substrate, wherein projections of the first beam, the second beam, and the third beam onto the substrate are parallel; and
a platform;
wherein each of the third beams connecting the platform to a corresponding second frames, wherein activation of the plurality of microactuators causes movement of the platform with respect to the substrate.

25. The microactuator assembly according to claim 24, wherein the movement of the platform with respect to the substrate comprises movement of the platform away from or toward the substrate.

26. The microactuator assembly according to claim 25, wherein the platform remains parallel to the substrate during the movement.

27. The microactuator assembly according to claim 24, wherein the movement comprises tilting.

28. The microactuator assembly according to claim 24, wherein there is no significant lateral displacement of the platform with respect to the substrate during the movement.

29. The microactuator assembly according to claim 24, wherein the movement allows 1D angular scanning of the platform.

30. The microactuator assembly according to claim 29, wherein 1D angular scanning of the platform is accomplished via actuation of one of the plurality of microactuators.

31. The microactuator assembly according to claim 24, wherein activation of two adjacent microactuators allows 2D tilting of the platform.

32. The microactuator assembly according to claim 31, wherein actuation of the two adjacent microactuators allows 2D angular scanning of the platform.

33. The microactuator assembly according to claim 24, wherein activation of the at least one of the first, second, and third beams is electrothermal actuation.

34. The microactuator assembly according to claim 24, wherein for each actuator, activation of the at least one of the first, second, and third beams comprises activation of the first beam, the second beam, and the third beam with a single driving voltage.

35. The microactuator assembly according to claim 24, wherein the plurality of microactuators comprises four microactuators.

36. The microactuator according to claim 1, wherein activation of the at least one of the first, second, and third beams comprises activation of the first beam, the second beam, and the third beam with a single driving voltage.

* * * * *